United States Patent
Momose

(10) Patent No.: US 7,843,226 B2
(45) Date of Patent: Nov. 30, 2010

(54) SEMICONDUCTOR INTEGRATED CIRCUIT DEVICE AND TEST TERMINAL ARRANGEMENT METHOD

(75) Inventor: Takayuki Momose, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/585,206

(22) Filed: Sep. 8, 2009

(65) Prior Publication Data

US 2010/0060313 A1    Mar. 11, 2010

(30) Foreign Application Priority Data

Sep. 9, 2008    (JP) .............................. 2008-230509

(51) Int. Cl.
*H03K 19/00* (2006.01)

(52) U.S. Cl. ......................................... 326/101; 326/16

(58) Field of Classification Search ................... 326/16, 326/37–41, 101–103
See application file for complete search history.

(56) References Cited

U.S. PATENT DOCUMENTS

| 6,426,645 | B1 | 7/2002 | Seki | |
|---|---|---|---|---|
| 7,263,679 | B2 * | 8/2007 | Kuge et al. | ..................... 716/10 |
| 2004/0172605 | A1 | 9/2004 | Kuge et al. | |
| 2007/0170587 | A1 * | 7/2007 | Honda | .......................... 257/737 |

FOREIGN PATENT DOCUMENTS

| JP | 4-93047 | 3/1992 |
|---|---|---|
| JP | 2000-260880 | 9/2000 |
| JP | 2004-260093 | 9/2004 |

* cited by examiner

*Primary Examiner*—Don P Le
(74) *Attorney, Agent, or Firm*—McGinn IP Law Group, PLLC

(57) ABSTRACT

A semiconductor integrated circuit device includes a column of first logic circuit cells arranged along a first side of a chip and a column of second logic circuit cells arranged along a second side orthogonal to the first side. At a corner part where the first side crosses the second side, a first test logic circuit cell is arranged to have its long side faced with a side of a cell at an end portion of the column of the first logic circuit cells and a second logic circuit cell is arranged to have its long side faced with a side of a cell at an end portion of the column of the second logic circuit cells. The first and the second test logic circuit cells are arranged so a that planar shapes thereof are symmetrical (mirror symmetrical) to each other with respect to a virtual line intermediate between the oblique sides arranged opposite to each other.

11 Claims, 2 Drawing Sheets

SEMICONDUCTOR INTEGRATED CIRCUIT DEVICE AND TEST TERMINAL ARRANGEMENT METHOD

REFERENCE TO RELATED APPLICATION

This application claims priority to Japanese Patent Application No. 2008-230509 (filed Sep. 9, 2008) which is hereby expressly incorporated by reference herein in their entireties.

BACKGROUND OF THE INVENTION

1. Field of the Invention

The present invention relates to a semiconductor integrated circuit device. More specifically, the invention relates to test terminal arrangement in the semiconductor integrated circuit device and a test terminal arrangement method in the semiconductor integrated circuit.

2. Description of Related Art

As a master-slice type semiconductor device, a configuration as shown in FIG. 2 is disclosed in Patent Document 1. A peripheral circuit region of the semiconductor device includes a first cell 40 having a test terminal 10, second cells 50-1 to 50-2 which are respectively connected to signal terminals 20 and 30 and each of which inputs/outputs a signal, third cells 60-1 to 60-2 which respectively include power supply terminals 61 and 62, a fourth cell 70-1 which is not connected to the signal terminal 20, and a fifth cell 80-1 provided at one of four corners. A potential fixing circuit 26 (36) that fixes potentials at input signal wirings arranged on n cells (n<N) of N second cells is provided. A control signal wiring 42 provided from the test terminal along the peripheral circuit region is connected to a control terminal of the potential fixing circuit 26 (36), and a plurality of buffers 100 are connected midway between the test terminal and the control terminal of the potential fixing circuit 26 (36). A delay and wave-form blunting of a control signal which turns on/off the circuit that fixes the potentials of the signal input wirings is thereby canceled.

As a chip corner part cell, Patent Document 2, for example, discloses a configuration in which the shape of an input/output circuit cell at a chip corner part is set to a right triangle having one 45-degree angle. With this configuration, the area of the chip corner part can be effectively utilized, and the number of input/output terminals can be increased.

With respect to a go round wiring for testing, repeaters (buffers) inserted in the go round wiring which will be described later, a description of Patent Document 3, for example, is referred to.

[Patent Document 1] JP Patent Kokai Publication No. JP-P-2000-260880A (FIG. 1)

[Patent Document 2] JP Patent Kokai Publication No. JP-A-04-93047 (FIG. 2)

[Patent Document 3] JP Patent Kokai Publication No. JP-P-2004-260093A (FIG. 9)

SUMMARY

An analysis by the present invention will be given below.

In case a test terminal is provided in the master-slice semiconductor device, an approach is used in which a part of IO cells arranged are replaced by test terminals, and a repeater (buffer) is added as necessary. With this approach, a desired test can be carried out by using test terminals. However, the part of IO cells is occupied for the test.

When chip design is performed with the master-slice scheme, it is necessary to initially arrange IO cells of the number corresponding to the number of terminals to be used by a user and the test terminals. For this reason, the chip size will increase.

When it is so arranged that a part of the user terminals are not occupied by test terminals, the user terminals that are necessary can be allocated. However, if the same number of the user terminals as the part of the user terminals occupied by the test terminals, are to be secured, an increase in the chip size cannot be avoided. Further, the semiconductor device tends to have a remarkably increasing number of pins along with advancement of functions. Accordingly, when the number of IOs is simply increased, the chip size will further increase, thus resulting in an increase in the cost.

The present invention, which seeks to solve one or more of the problems described above, is generally configured as follows.

According to one aspect of the present invention, there is provided a semiconductor integrated circuit device including first and second logic circuit cells at least at one chip corner part of four corners of a chip, each of the first and second logic circuit cells having a shape of a trapezoid in which a side facing an oblique side crosses each of a short side and a long side at a right angle, the first and second logic circuit cells being arranged with oblique sides thereof facing to each other.

The semiconductor integrated circuit device according to the present invention includes: a first logic circuit cell column arranged along a first side of the chip; and a second logic circuit cell column arranged along a second side of the chip orthogonal to the first side. At the chip corner part where the first side crosses the second side, the first logic circuit cell is arranged so that the long side thereof faces a side of a cell at an end portion of the first logic circuit cell column, and the second logic circuit cell is arranged so that the long side thereof faces a side of a cell at an end portion of the second logic circuit cell column. The first logic circuit cell and the second logic circuit cell are arranged so that planar shapes of the first and second logic circuit cells are symmetrical to each other with respect to a virtual line intermediate between the oblique sides arranged opposite to each other.

In the present invention, each of the first logic circuit cell and the second logic circuit cell includes a test logic circuit cell connected to a test terminal.

In the present invention, there are provided a plurality of peripheral test wirings on a metal interconnect layer in a region around the chip, with a width corresponding to the length of the long side of each of the first logic circuit cell and the second logic circuit cell constituting the test logic circuit cell. The plurality of peripheral test wirings may be respectively connected to connecting portions within regions of the first logic circuit cell and the second logic circuit cell located immediately below the plurality of peripheral test wirings at the chip corner part through conductive members.

According to the present invention, there is provided a test terminal arrangement method comprising:

arranging first and second test logic circuit cells at least at one corner out of four corners of a chip, each of the first and second logic circuit cells having a shape of a trapezoid in which a side facing an oblique side crosses each of a short side and a long side at a right angle, the first and second logic circuit cells being arranged with oblique sides thereof facing to each other; and connecting each of the first and second test logic circuit cells to a test pad.

According to the present invention, the occupation of a part of IO cells by test terminals can be eliminated. An increase in the chip size caused by the test terminal can be thereby prevented. Then, an increase in the cost can be prevented.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

In order to describe the present invention mentioned above in further detail, an exemplary embodiment will be described with reference to appended drawings.

In one aspect of the present invention, a semiconductor integrated circuit device includes first and second test logic circuit cells (4A, 4B) provided at least at one chip corner part of four corners of a chip. Each of the first and second test logic circuit cells has a shape of a trapezoid in which a side facing an oblique side crosses each of a short side and a long side at a right angle. The first and second test logic circuit cells are arranged with their oblique sides facing to each other.

In the present invention, there are provided a column of first logic circuit cells (2) arranged along a first side of the chip and a column of second logic circuit cells (2') arranged along a second side of the chip orthogonal to the first side. At the chip corner part where the first side crosses the second side, the first test logic circuit cell (4A) is arranged to cause its long side to face a side of a cell at an end portion of the column of the first logic circuit cells (2). The second test logic circuit cell (4B) is arranged to cause its long side to face a side of a cell at an end portion of the column of the second logic circuit cells (2'). The first test logic circuit cell (4A) and the second test logic circuit cell (4B) are arranged so that planar shapes of the first and second logic circuit cells are symmetrical (mirror symmetrical) to each other with respect to a virtual line (8) intermediate between the oblique sides arranged opposite to each other. Each of the first and second test logic circuit cells (4A, 4B) is one of an input cell, an output cell, and an input/output cell.

The first and second logic circuit cells (4A, 4B) are test logic circuit cells that are connected to test pads (5A, 5B).

A plurality of peripheral test wirings (7) are provided on a metal interconnect layer in a region around the chip with a width corresponding to the length of the long side of each of the first test logic circuit cell (4A) and the second test logic circuit cell (4B). The plurality of peripheral test wirings (7) are connected to contacts within regions of the first test logic circuit cell (4A) and the second test logic circuit cell (4B) located immediately below the plurality of peripheral test wirings (7) at the chip corner region. According to the present invention, partial occupation of an IO cell by a test terminal is eliminated, and an increase in the chip size caused by the test terminal is thereby prevented. A description will be given below in connection with an embodiment.

Figure 1:
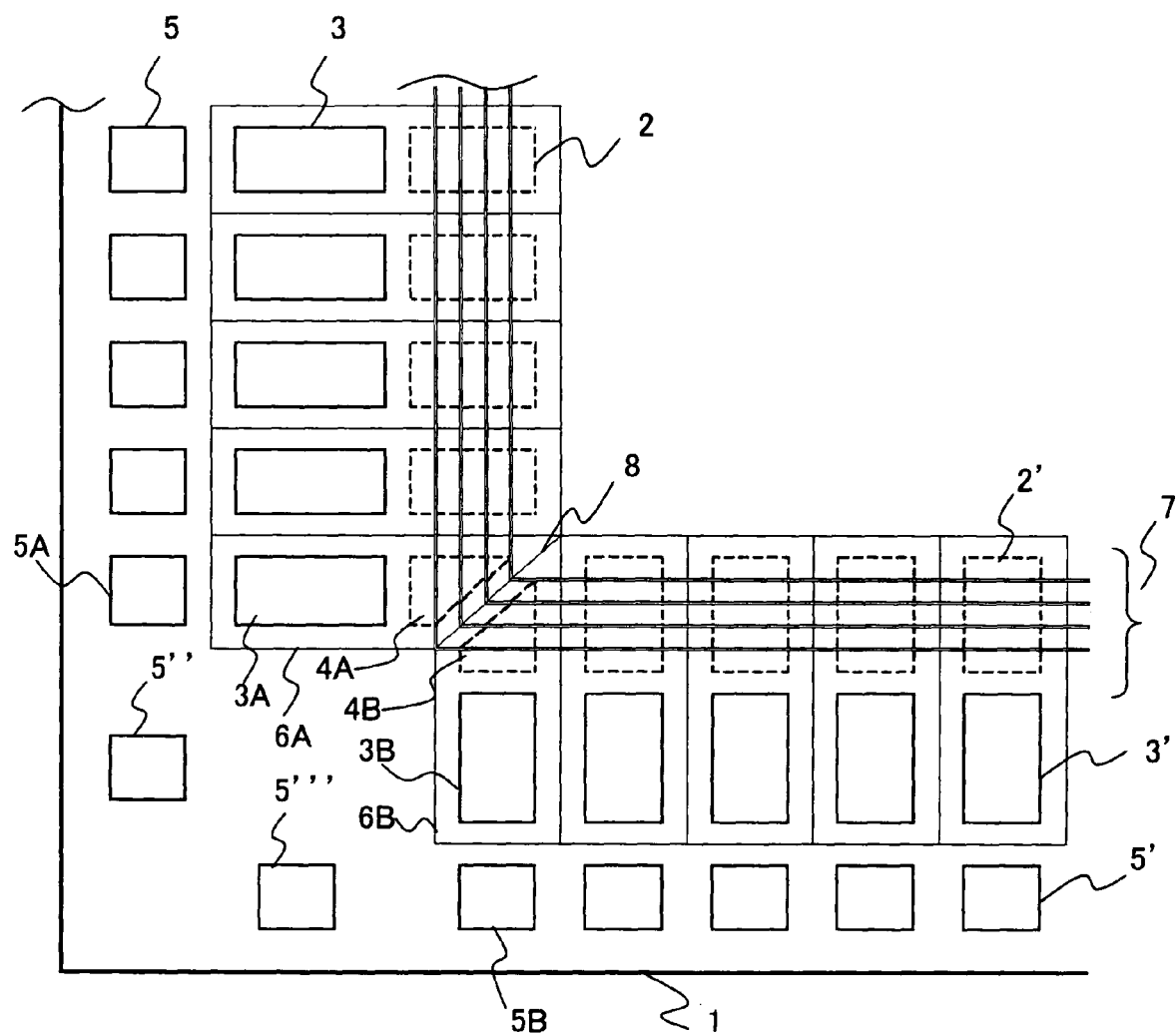
FIG. 1 is a diagram showing a configuration in an embodiment of the present invention.
Figure 2:
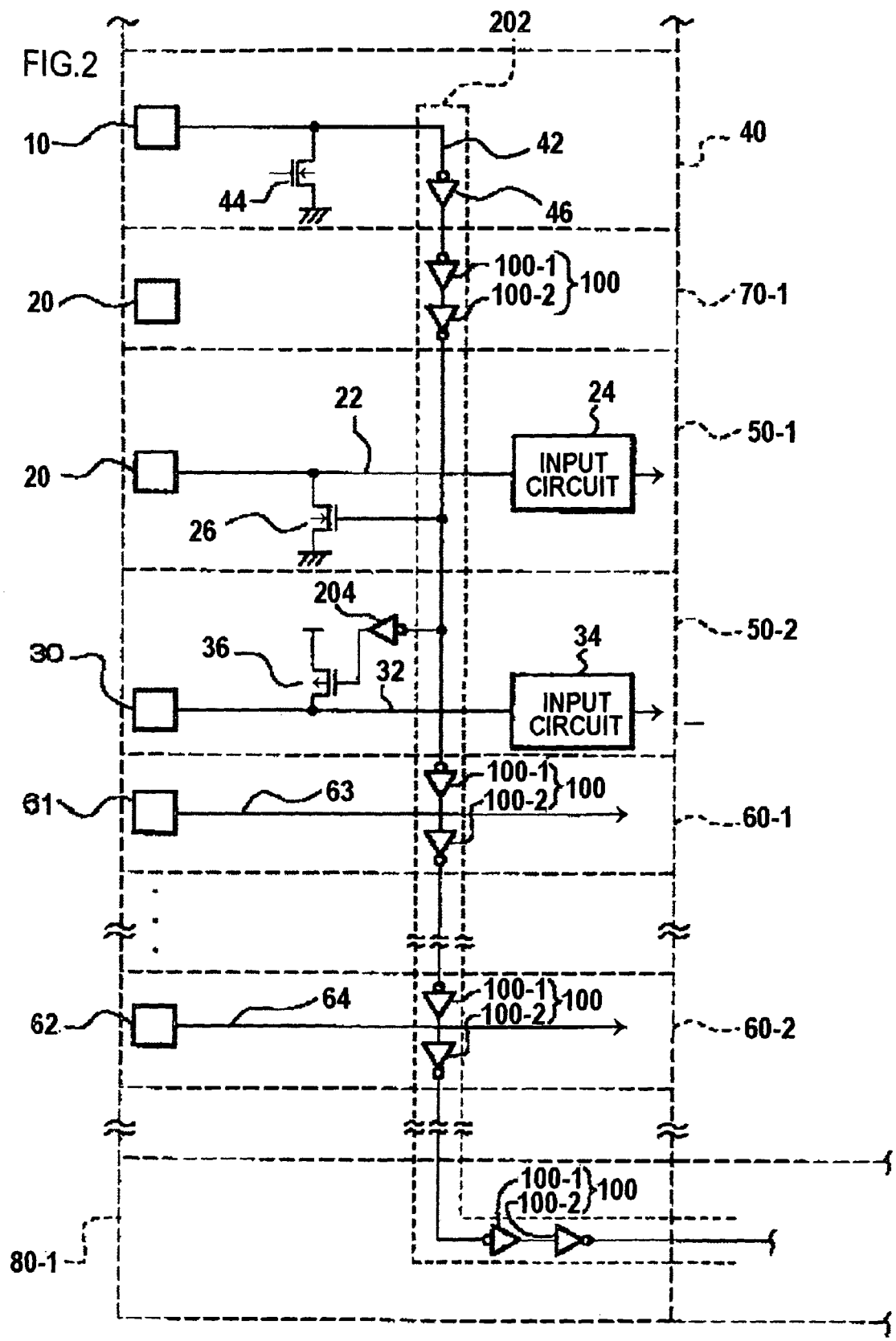
FIG. 2 is a diagram showing a configuration of Patent Document 1.

FIG. 1 is a diagram showing a configuration of a semiconductor integrated circuit device in an exemplary embodiment of the present invention. FIG. 1 shows a layout of (a lower left) one of four corner parts of the semiconductor integrated circuit device.

As shown in FIG. 1, the present exemplary embodiment includes test logic circuits 4A and 4B each having a shape of a trapezoid at the corner part of a master-slice gate array. The long side (bottom base) of each of the test logic circuits 4A and 4B is set to have a length corresponding to the height of a corresponding one of logic circuit sections 2 and 2', and oblique sides of the test logic circuits 4A and 4B face to each other with a space interposed therebetween. The logic circuit sections 2 and 2' include IO cells (each of which is one of an input cell, an output cell, and an input/output cell). The logic circuit sections 2 and 2' are also referred to as logic circuit cells.

Planar shapes of a test terminal area 6A (e.g. the test logic circuit 4A+an ESD (Electric Static Discharge) element section 3A) and a test terminal area 6B (test logic circuit 4B+an ESD element section 3B) that are arranged are set to be symmetrical with respect to a center line (virtual line) 8 between the oblique sides of the test logic circuits 4A and 4B. That is, the test logic circuits 4A and 4B are arranged in mirror symmetry, and the ESD element sections 3A and 3B are arranged in mirror symmetry, with respect to the virtual line 8.

In the example in FIG. 1, the planer shape of each cell of the test logic circuits 4A and 4B is set to be a so-called right angle trapezoid in which a side facing the oblique side crosses each of the long side (bottom base) and the short side (top base) at a right angle.

When ordinary IO terminals are arranged at the corner part, parts of areas of the IO terminals interfere with each other. Then, in the parts of areas which interfere with each other in this embodiment, the sides of the test logic circuit 4A of the test terminal area 6A and the test logic circuit 4B of the test terminal area 6B that face to each other are set to be oblique.

In the present exemplary embodiment, the test terminal area 6A includes the ESD element section 3A and the test logic circuit 4A (in the shape of the right angle trapezoid), and the test terminal area 6B includes the ESD element section 3B and the test logic circuit 4B (in the shape of the right angle trapezoid). The test logic circuits 4A and 4B are the minimum requirement for a test. Each of the test terminal areas 6A and 6B is also set to have the planar shape of a right angle trapezoid. That is, in the planar shape of each of the test terminal areas 6A and 6B, the center line (virtual line) 8 is set to an oblique side, and a side that faces the oblique side (side that faces a corresponding one of pads 5A and 5B) crosses each of the top base and the bottom base of the right angle trapezoid at a right angle.

The logic circuit sections 2 and 2' are connected to pads 5 and 5' through ESD element sections 3 and 3', respectively. Likewise, the test logic circuits 4A and 4B are connected to the pads 5A and 5B through the ESD element sections 3A and 3B, respectively. Though no limitation is imposed, each of pads 5" and 5'" at the corner part is used as a pad for a power supply or grounding. The pads 5, 5', 5", 5'", 5A, and 5B are connected to pads on a package substrate not shown (by wire bonding or the like) or the like, and are connected to external pins of the device. The ESD elements have a same configuration and each has a known circuit configuration that uses a diode (Zener diode) for ESD protection.

In the example shown in FIG. 1, the layout area of each of the test logic circuits 4A and 4B at the corner part which functions as a test terminal is slightly smaller than an IO cell (of the logic circuit section 2 or 2') which functions as a user terminal. Necessary logic circuits such as a receiver, a tri-state type output buffer, and the like are provided at the logic circuit sections 2 and 2' as the IO cells. When designing the device, selection of the input cell, output cell, and input/output cell is made as necessary. On contrast therewith, in each of the test logic circuits 4A and 4B, a logic may be limited specifically for a test in advance, and one of I (input section) and O (output section) of an IO cell may be arranged.

Peripheral test wirings 7 are global wirings wired over the IO cells around the chip (in columns of the logic circuit sections 2 and 2' and the test logic circuits 4A and 4B at the corner part). Each of the peripheral test wirings 7 (from innermost to outermost peripheral side wirings) is connected to a connecting region (contact region, wiring pad, or the like) within the regions of the test logic circuits 4A and 4B immediately below a metal interconnect layer on the top layer of the substrate through a conductive member (through hole or the like), from the metal interconnect layer.

At a time of normal operation in the present exemplary embodiment, each of the columns of the logic circuit sections 2 and 2' supplies a signal received at an input pin (or an input/output pin) to a corresponding internal circuit, or outputs a signal from the corresponding internal circuit to an output pin (or input/output pin). Though no limitation is imposed, at a time of the test, a test signal may be supplied from a tester not shown to each of the test logic circuits 4A and 4B through the test terminal, and the test signal may be transmitted to the peripheral test wirings 7 through the test terminal. A signal from the peripheral test wirings 7 may be output to the tester through the test terminal. For the peripheral test wirings 7, an arbitrary signal such as a control signal, a data signal, or a clock signal for the test may be employed.

In the present exemplary embodiment, buffers (repeaters) that receive the peripheral wirings 7 and perform output may be provided at the logic circuit section 2 and 2'. The columns of the logic circuit sections 2 and 2' and the test logic circuits 4A and 4B at the corner part may form a boundary scan circuit.

According to the present exemplary embodiment, the peripheral test wirings 7 are wired on the test terminal areas 6A and 6B. Thus, taking out the peripheral test wiring 7 to outside is facilitated. Further, the test logic circuits 4A and 4B are placed at the corner part, and the test signals are brought together on the peripheral test wirings 7 around the chip. Limitation of arrangement (including a wiring layer layout) of the user terminals and user circuits (internal circuits) or limitation of design latitude for the test can be thereby avoided. That is, according to the present exemplary embodiment, the test terminals are arranged in a dead space at the corner part. A situation where the IO cell that can be used by a user is limited due to the test terminal can be thereby resolved.

According to the present exemplary embodiment, the test terminals are arranged in the dead space at the corner part. Thus, even if the test logic circuits corresponding to a maximum of eight terminals are added to four corner parts, the test logic circuits do not occupy the IO cells (logic circuit portions).

An operation and effect of the present exemplary embodiment will be described.

The test terminal areas are provided in the dead space at the chip corner part. The test terminal can be thereby efficiently used without using the IO cell.

In a master-slice ASIC, the test terminals are arranged in the trapezoidal areas at the corner part. The trapezoidal areas have oblique surfaces that contact with each other. Efficient utilization of the dead space is thereby allowed.

Further, the test terminal is configured without using the IO cell for the user. Efficient utilization of the IO cells to be used by the user is thereby made possible. The test terminals are arranged in the test terminal areas at the chip corner part. With this arrangement, even if the number of test items is increased, the test terminal areas are arranged at a maximum of eight locations (two test terminal areas for each of the four corner parts, for example). Test item addition can be thereby accommodated without using the IO cell.

The disclosures of the Patent Documents 1, 2, and 3 described above are incorporated herein by reference. Modifications and adjustments of the exemplary embodiment and an embodiment are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A semiconductor integrated circuit device, comprising:
    first and second logic circuit cells provided at least at one corner part out of four corners of a chip of the semiconductor integrated circuit device,
    each of the first and second logic circuit cells having a shape of a trapezoid in which a side facing an oblique side crosses each of a short side and a long side at a right angle, the first and second logic circuit cells being arranged with the oblique sides thereof facing to each other.

2. The semiconductor integrated circuit device according to claim 1, including:
    a first logic circuit cell column including a plurality of first logic circuit cells arranged in a line along a first side of the chip; and
    a second logic circuit cell column including a plurality of second logic circuit cells arranged in a line along a second side of the chip orthogonal to the first side, the first side of the chip crossing the second side of the chip at the at the corner part, wherein
    the first logic circuit cell provided at the corner part is arranged to have the long side thereof faced with a side of a cell at an end portion of the first logic circuit cell column,
    the second logic circuit cell provided at the corner part is arranged to have the long side thereof faced with a side of a cell at an end portion of the second logic circuit cell column, and
    the first and second logic circuit cells provided at the corner part have planar shapes symmetrical to each other with respect to a virtual line intermediate between the oblique sides thereof arranged opposite to each other.

3. The semiconductor integrated circuit device according to claim 1, wherein each of the first logic circuit cell and the second logic circuit cell includes one of an input cell, an output cell, and an input/output cell.

4. The semiconductor integrated circuit device according to claim 1, wherein each of the first logic circuit cell and the second logic circuit cell includes a test logic circuit cell connected to a test terminal.

5. The semiconductor integrated circuit device according to claim 4, comprising:

a plurality of peripheral test wirings arranged on a metal interconnect layer in a region around the chip, with a width corresponding to a length of the long side of each of the first logic circuit cell and the second logic circuit cell comprising the test logic circuit cell.

6. The semiconductor integrated circuit device according to claim 5, wherein the plurality of peripheral test wirings are respectively connected to connecting portions within regions of the first logic circuit cell and the second logic circuit cell located immediately below the plurality of peripheral test wirings at the corner part through conductive members.

7. A method for arranging test terminals in a semiconductor integrated circuit device, the method comprising:

arranging first and second test logic circuit cells at least at one corner out of four corners of a chip of the semiconductor integrated circuit device, each of the first and second logic circuit cells having a shape of a trapezoid in which a side facing an oblique side crosses each of a short side and a long side at a right angle, the first and second logic circuit cells being arranged with the oblique sides thereof facing to each other; and connecting each of the first and second test logic circuit cells to a test pad.

8. The method according to claim 7, comprising:

arranging a first logic circuit cell column including a plurality of first logic circuit cells in a line along a first side of the chip; and arranging a second logic circuit cell column including a plurality of second logic circuit cells in a line along a second side of the chip orthogonal to the first side, the first side of the chip crossing the second side of the chip at the at the corner part, arranging the first logic circuit cell at the corner part to have the long side thereof faced with a side of a cell at an end portion of the first logic circuit cell column, and arranging the second logic circuit cell at the corner part to have the long side thereof faced with a side of a cell at an end portion of the second logic circuit cell column, the first and second logic circuit cells provided at the corner part having planar shapes symmetrical to each other with respect to a virtual line intermediate between the oblique sides thereof arranged opposite to each other.

9. The method according to claim 7, wherein each of the first logic circuit cell and the second logic circuit cell includes one of an input cell, an output cell, and an input/output cell.

10. The method according to claim 7, comprising arranging a plurality of peripheral test wirings on a metal interconnect layer in a region around the chip, with a width corresponding to a length of the long side of each of the first test logic circuit cell and the second test logic circuit cell.

11. The method according to claim 10, comprising connecting the plurality of peripheral test wirings respectively connected to connecting portions within regions of the first logic circuit cell and the second logic circuit cell located immediately below the plurality of peripheral test wirings at the corner part through conductive members.

* * * * *